(12) United States Patent
Chang et al.

(10) Patent No.: US 9,748,236 B1
(45) Date of Patent: Aug. 29, 2017

(54) FINFET DEVICE WITH ENLARGED CHANNEL REGIONS

(71) Applicant: GLOBALFOUNDRIES Inc., Grand Cayman (KY)

(72) Inventors: Ming-Cheng Chang, Dresden (DE); Ran Yan, Dresden (DE); Bo Bai, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/054,355

(22) Filed: Feb. 26, 2016

(51) Int. Cl.
| | | |
|---|---|---|
| *H01L 27/088* | (2006.01) | |
| *H01L 21/8234* | (2006.01) | |
| *H01L 21/3213* | (2006.01) | |
| *H01L 21/306* | (2006.01) | |

(52) U.S. Cl.
CPC .... *H01L 27/0886* (2013.01); *H01L 21/30604* (2013.01); *H01L 21/32133* (2013.01); *H01L 21/823418* (2013.01); *H01L 21/823431* (2013.01)

(58) Field of Classification Search
CPC ..... H01L 21/823431; H01L 21/823821; H01L 21/845; H01L 27/0886; H01L 27/0924; H01L 27/10826; H01L 27/10879; H01L 27/1211; H01L 29/41791; H01L 29/66795; H01L 29/7831

USPC ........ 257/288, 328, 368, 369; 438/137, 138, 438/151, 156, 173, 197, 199
See application file for complete search history.

(56) References Cited

U.S. PATENT DOCUMENTS

| | | | | |
|---|---|---|---|---|
| 2012/0025312 | A1* | 2/2012 | Scheiper | ......... H01L 21/823807 257/347 |
| 2013/0341733 | A1* | 12/2013 | Erickson | ......... H01L 21/823431 257/401 |
| 2016/0099342 | A1* | 4/2016 | Basker | ................ H01L 27/0924 438/283 |
| 2017/0053943 | A1* | 2/2017 | Cheng | ................. H01L 27/1211 |

* cited by examiner

*Primary Examiner* — Jarrett Stark
*Assistant Examiner* — Shahed Ahmed
(74) *Attorney, Agent, or Firm* — Amerson Law Firm, PLLC

(57) ABSTRACT

A semiconductor device including a semiconductor layer, a plurality of semiconductor fins formed on a surface of the semiconductor layer and a plurality of gate electrodes formed over the surface of the semiconductor layer is provided. The semiconductor fins extend in parallel to each other along a first direction parallel to the surface of the semiconductor layer and have a first height in a second direction that is perpendicular to the first direction, and the gate electrodes comprise longitudinal portions extending parallel to the semiconductor fins along the first direction and, in particular, having a second height in the second direction lower than the first height.

19 Claims, 4 Drawing Sheets

FINFET DEVICE WITH ENLARGED CHANNEL REGIONS

BACKGROUND

1. Field of the Disclosure

Generally, the present disclosure relates to the field of integrated circuits and semiconductor devices and, more particularly, to FinFET devices with enlarged channel regions.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, metal-oxide-semiconductor (MOS) technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer.

Although significant advantages may be obtained with respect to performance and controllability of sophisticated planar transistor architectures, in view of further device scaling, new transistor configurations have been proposed in which a "three-dimensional" architecture may be provided in an attempt to obtain a desired channel width, while at the same time maintaining superior controllability of the current flow through the channel region. To this end, so-called FinFETS have been proposed in which a thin sliver or fin of silicon may be formed in a thin active layer of a silicon-on-insulator (SOI) substrate, wherein at least on both sidewalls of the fin, and possibly on a top surface thereof, a gate dielectric material and a gate electrode material may be provided, thereby realizing a "double gate" or "tri-gate" transistor, the channel region of which may be fully depleted. Typically, in sophisticated applications, the width of the silicon fins is on the order of 10-20 nm and the height thereof is on the order of 30-40 nm.

Thus, FinFET transistor architectures, which may also be referred to herein as multiple gate transistors, may provide advantages with respect to increasing the effective coupling of the gate electrode to the various channel regions without requiring a corresponding reduction in the thickness of the gate dielectric material. Moreover, by providing this non-planar transistor architecture, the effective channel width may also be increased so that, for given overall transistor dimensions, an enhanced current drive capability may be accomplished. For these reasons, great efforts have been made in order to provide enhanced transistor performance on the basis of non-planar transistor architectures.

It is noted that both planar and three-dimensional transistor devices can be formed according to the replacement gate approach or the gate first approach. In the replacement gate technique, a so-called "dummy" or sacrificial gate structure is initially formed and remains in place as many process operations are performed to form the device, for example, the formation of doped source/drain regions, performing an anneal process to repair damage to the substrate caused by the ion implantation processes and to activate the implanted dopant materials. At some point in the process flow, the sacrificial gate structure is removed to define a gate cavity where the final HK/MG gate structure for the device is formed. Using the gate first technique, on the other hand, involves forming a stack of layers of material across the substrate, wherein the stack of materials includes a high-k gate insulation layer (with a dielectric constant k larger than 5), one or more metal layers, a layer of polysilicon, and a protective cap layer, for example, silicon nitride. One or more etching processes are performed to pattern the stack of materials to thereby define the basic gate structures for the transistor devices. Formation of an e-fuse in accordance with the present disclosure may be readily integrated in both the replacement gate process flow and gate first process flow.

FIGS. 1a-1c illustrate a conventional process of manufacturing a FinFET device. In the shown example, a gate first approach is described. As shown in FIG. 1a, semiconductor fins 110 are formed on a base layer 102. The base layer 102 may be a buried oxide layer formed on a semiconductor bulk substrate 101 of an SOI wafer. Alternatively, the base layer 102 may be a semiconductor layer, for example, it may represent part of a semiconductor bulk substrate 101. The semiconductor material of the fins 110 may be formed on the basis of complex epitaxial growth techniques. The fins 110 may be formed with lateral dimensions in accordance with the overall design rules. A cap layer 112 may be provided prior to patterning the fins 110 if the top surfaces of the fins 110 are not to be used as channel regions. The cap layer 112 may comprise or consist of silicon oxide or silicon nitride, for example. Furthermore, prior to or after patterning the fins 110, a basic dopant profile may be established, for instance with respect to defining the basic conductivity type of the fins and the like. This may be accomplished by implantation techniques and/or by incorporating a desired dopant species during the epitaxial growth process for forming the material for the fins 110. Next, a gate electrode structure is formed (see FIG. 1b), for instance, by forming an appropriate gate dielectric material 121, such as a silicon dioxide or a high-k dielectric material, which may be accomplished by sophisticated oxidation techniques and the like, followed by the deposition of the gate electrode material 120, such as polysilicon. The gate electrode structure may have appropriate lateral dimensions so as to cover a central portion of the fins 110 and thereby define corresponding channel lengths for each of the fins 110.

After planarizing the electrode material, which may also comprise providing appropriate materials for forming a hard mask, adjusting the overall optical characteristics on the basis of an anti-reflective coating (ARC) material and the like, the electrode material may be patterned by using a resist mask obtained by lithography and performing an appropriate etch sequence, wherein a high degree of etch selectivity between the gate electrode material and the gate dielectric material may provide for integrity of the end portions of the fins 110. For example, well-established yet complex process techniques are available for etching polysilicon material selectively to silicon dioxide.

After forming the gate electrode structure comprising the gate electrode material 120 and the gate dielectric material 121, drain and source areas may be formed, for instance, by ion implantation, which may include the deposition of a spacer material and patterning the same, if required, while, in other cases, a semiconductor material may be formed first in order to electrically connect end portions of the fins at both sides of the gate electrode structure in order to provide respective drain and source areas. For this purpose, the end portions of the fins 110 not covered by the gate electrode structure may be exposed by removing the gate dielectric material 121, which may be accomplished by well-established etch recipes, for instance on the basis of hydrofluoric acid and the like. Thereafter, the exposed surface portions of the fins 110 may be prepared for a subsequent selective epitaxial growth process, which may involve well-established cleaning processes and the like.

A resulting FinFET device 100 is shown in a 3D view in FIG. 1c. Each of the fins 110 in combination with the common gate electrode structure 120 may represent a single transistor cell of the device 100. In principle, the fins 110 may exhibit an appropriate dopant concentration so as to define corresponding drain and source areas in each of the fins 110, while, in other strategies, corresponding drain and source regions may be formed in a later stage after connecting the end portions of the fins 110 by growing a further semiconductor material so as to fill the spacing between the individual fins 110.

However, the effective channel lengths and, in particular, the channel height extensions (in the direction perpendicular to the substrate whereupon the FinFET is formed) of conventionally formed FinFETs, and thereby the drive currents, are limited. There is a general need to improve the overall performance of FinFETs of the art, in particular, in view of the ongoing demand for size reductions.

In view of the situation described above, the present disclosure provides FinFET devices that may exhibit improved performance characteristics as compared to prior art FinFET devices.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein relates to FinFET devices and methods of manufacturing FinFET devices. In particular, the method disclosed herein may be used in manufacturing FinFET devices that may exhibit increased performance due to enlarged channel regions. In one illustrative embodiment, the gate electrodes of the devices run parallel to semiconductor fins formed above or over a semiconductor layer.

In one illustrative embodiment, a semiconductor device disclosed herein may include a semiconductor layer, a plurality of semiconductor fins formed on a surface of the semiconductor layer and a plurality of gate electrodes formed over the surface of the semiconductor layer. In this example, the semiconductor fins have an axial length wherein the fins extend or are positioned parallel to each other along a first direction that corresponds to the axial length of the fins, wherein the first direction is parallel to the surface of the semiconductor layer. The fins also have a first height in a second (vertical) direction that is perpendicular to the first (horizontal) direction and the gate electrodes comprise longitudinal portions extending parallel to the semiconductor fins along the first direction and, in particular, having a second height in the second direction lower than the first height.

Furthermore, a FinFET device is provided including a plurality of semiconductor fins formed on a surface of a semiconductor layer extending in parallel to each other in a first (horizontal) direction parallel to the surface of the semiconductor layer, wherein each of the semiconductor fins comprises a transistor channel region and a gate electrode layer partially extending along the first direction between the semiconductor fins and, in particular, having a lower height in a second (vertical) direction perpendicular to the first direction than the height of the semiconductor fins in the second direction.

In addition to semiconductor devices, methods of manufacturing semiconductor devices are provided. According to one example, a method of manufacturing a semiconductor device includes providing a semiconductor layer, forming a plurality of semiconductor fins on a surface of the semiconductor layer extending in parallel to each other along a first direction parallel to the surface of the semiconductor layer, and forming a plurality of gate electrodes comprising longitudinal portions extending parallel to the semiconductor fins along the first direction.

According to another example, a method of forming a FinFET device includes etching a semiconductor bulk substrate to form a plurality of semiconductor fins parallel to each other, forming a gate electrode layer over the semiconductor bulk substrate and etching the gate electrode layer to form gate electrodes adjacent to the semiconductor fins with a height lower than the height of the semiconductor fins.

It is noted that, in principle, according to exemplary methods, the FinFET device may be formed in a process flow of a gate first or a replacement gate manufacturing technology.

BRIEF DESCRIPTION OF THE DRAWINGS

The disclosure may be understood by reference to the following description taken in conjunction with the accompanying drawings, in which like reference numerals identify like elements, and in which.

Figure 1A:
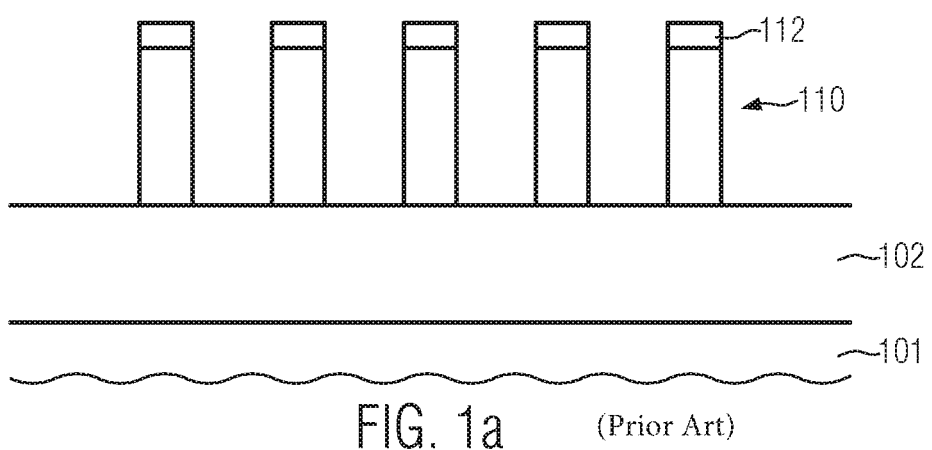
FIGS. 1a-1c illustrate a process of manufacturing a FinFET device of the art.
Figure 1B:
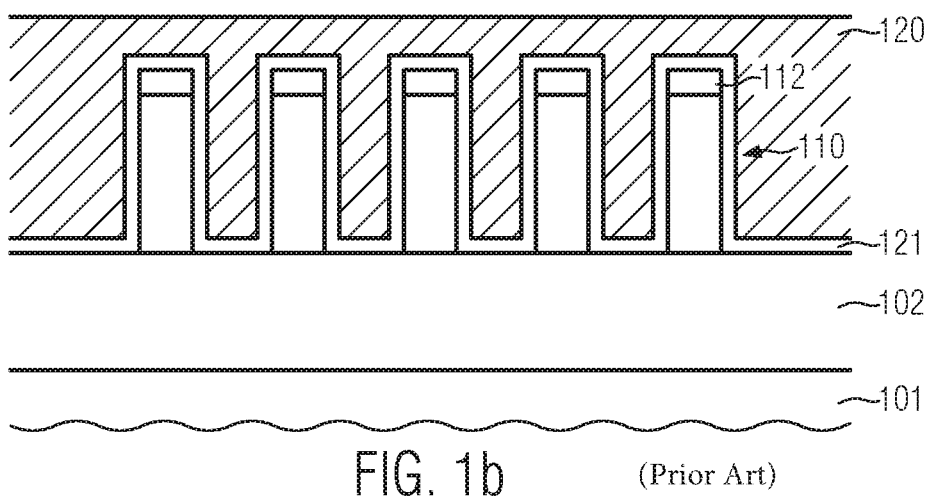

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the disclosure. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As used herein, spatial references "top," "bottom," "upper," "lower," "vertical," "horizontal" and the like, may be used for convenience when referring to structures of FinFETs. These references are intended to be used in a manner consistent with the drawings only for teaching purposes, and are not intended as absolute references for FinFET structures. For example, FinFETs may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices etc., in principle. The techniques and technologies described herein may be utilized to fabricate MOS integrated circuit devices, including NMOS integrated circuit devices, PMOS integrated circuit devices, and CMOS integrated circuit devices. In particular, the process steps described herein are utilized in conjunction with any semiconductor device fabrication process that forms gate structures for integrated circuits, including both planar and non-planar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor bulk substrate.

The present disclosure generally discloses various methods and techniques for forming FinFET devices and FinFET devices comprising semiconductor fins and gate electrodes formed around the semiconductor fins and extending all along longitudinal (length) directions of the semiconductor fins. Larger portions of the fins may be used for the channel regions of individual FinFETs as compared to the prior art devices described in the background section of this application. Thereby, stability of the operation and the drive current capabilities may be increased. Moreover, in at least some illustrative embodiments disclosed herein, smaller distances (pitches) between gate electrode structures of individual FinFETs as compared to the prior art devices may be achieved. In particular, manufacture of the herein disclosed FinFET devices may be accomplished in the context of the gate first approach that is less complex in terms of procedural steps as compared to the replacement gate approach. The short channel effect may also be reduced for aggressively down-scaled configurations (downscaling to even 7 nm technology, for example) and parasitic capacitances, in particular, overlap capacitances, may be significantly reduced.

Figure 2A:
FIGS. 2a-2c illustrate an exemplary process of manufacturing a FinFET device according to the present disclosure.
Figure 2B:
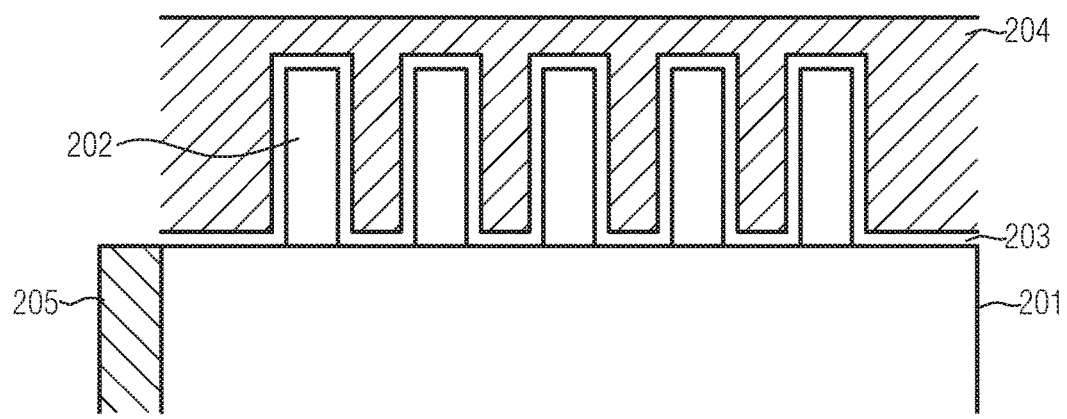
Figure 2C:
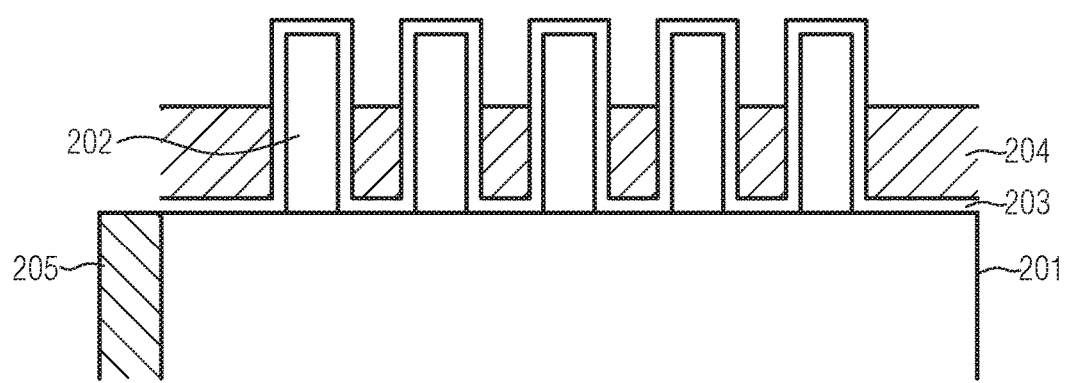

One illustrative embodiment disclosed herein for manufacturing a FinFET device is illustrated in FIGS. 2a-2c. As shown in FIG. 2a, a semiconductor layer 201 is provided. The semiconductor layer 201 provides the channel regions of the FinFET device to be formed and may be comprised of any appropriate semiconductor material, such as silicon, silicon/germanium, silicon/carbon, other II-VI or III-V semiconductor compounds and the like. The semiconductor layer 201 may be part of a bulk semiconductor substrate wherein insulation regions, for example, shallow trench insulations, may be formed. The bulk semiconductor substrate may be a silicon substrate, in particular, a single crystal silicon substrate. Other materials may be used to form the semiconductor substrate such as, for example, germanium, silicon germanium, gallium phosphate, gallium arsenide, etc. Insulation regions may define active regions and electrically isolate the FinFet device to be formed from other active or passive devices formed on the same substrate. The insulation regions may be parts of a contiguous trench isolation structure and may be formed by etching the bulk semiconductor substrate and filling the formed trenches with some dielectric material, for example, silicon oxide. In principle, the semiconductor layer 201 may be comprised in an SOI wafer. In this case, the semiconductor layer 201 is formed on an insulation/buried oxide layer that is formed on a bulk semiconductor substrate. The buried oxide layer may include a dielectric material, such as silicon dioxide, and may be an ultra-thin buried oxide (UT-BOX) having a thickness in a range from about 10-20 nm, for example.

In the manufacturing stage shown in FIG. 2b, semiconductor fins 202 are formed. The semiconductor fins 202 may be formed from the semiconductor layer 201 by etching or they may be formed by epitaxial growth. The semiconductor fins 202 may be formed by any suitable combination of lithographic processes that may involve forming a pattern and selectively etching a material. For example, the fins 202 may be formed using a double patterning process, e.g., resist-on-resist patterning techniques (which may include a lithography-etch-lithography-etch (LELE) process or a lithography-freeze-lithography-etch (LFLE) process). In other embodiments, the fins may be formed using interferometric lithography, imprint lithography, photolithography, extreme ultraviolet (EUV) lithography, or x-ray lithography. The semiconductor fins 202 run in parallel in a length direction along a horizontal surface of the semiconductor layer 201 and extend vertically, i.e., in a height direction perpendicular to the surface of the semiconductor layer 201.

The semiconductor fins 202 may have narrow widths in a horizontal direction perpendicular to the length direction of less than 50 nm. An oxide layer (not shown) may be formed on the semiconductor layer 201, in which case the fins run through the oxide layer to the semiconductor layer 201. It should be appreciated that the fins 202 may exhibit an appropriate dopant concentration so as to define corresponding drain and source areas in each of the fins 202. Alternatively, source/drain regions may be formed by epitaxial growth of a semiconductor material on the fins 202 and appropriately doping the epitaxially grown material. In addition, channel regions of the FinFET device to be formed may be formed by appropriately doping the respective regions of the semiconductor fins 202. In alternative examples, the channel regions might be maintained undoped.

A dielectric layer 203 is formed on the exposed surfaces of the semiconductor fins 202 and the surface of the semiconductor layer 201. The dielectric layer 203 may be formed of a high-k material (k>5) and may comprise a transitional metal oxide, such as at least one of hafnium oxide, hafnium dioxide and hafnium silicon-oxynitride. The high-k material layer 203 may be directly formed on the semiconductor layer 201.

As shown in FIG. 2b, a gate electrode layer 204 is formed on the dielectric layer 203 and over the semiconductor fins 202 and semiconductor layer 201. The gate electrode layer 204 may comprise a work function adjusting layer in contact with the dielectric layer 203. The work function adjusting layer may comprise titanium nitride (TiN) or any other appropriate work function adjusting metal or metal oxide that is known in the art. The gate electrode layer 204 may comprise polysilicon. The gate electrode layer 204 may comprise a metal gate. The material of the metal gate may depend on whether the transistor device to be formed is a P-channel transistor or an N-channel transistor. In embodiments wherein the transistor device is an N-channel transistor, the metal may include La, LaN or TiN. In embodiments wherein the transistor device is a P-channel transistor, the metal may include Al, AlN or TiN. After deposition of the gate electrode layer 204, planarization of its free horizontal surface, for example, by chemical mechanical polishing, may be performed.

Additionally, an oxide region 205 may be formed in the semiconductor layer 201 that serves as an isolation region to isolate the FinFET device to be formed from other active or passive devices. The region 205 may comprise or consist of silicon dioxide, for example.

In the manufacturing stage shown in FIG. 2c, the gate electrode layer 204 is etched. During the etching process, the dielectric layer 203 may serve as an etch stop layer on top of the semiconductor fins 202 and the surface of the semiconductor layer 201. Alternatively, a separate etch stop layer may be provided on the dielectric layer 203. As shown in FIG. 2c, the thickness of the gate electrode layer 204 is reduced in the vertical direction to a height below the height level of the semiconductor fins 202 by the etching process. Particularly, by removing portions of the gate electrode material during the etching process, upper portions of the semiconductor fins 202 are exposed above the recessed upper surface of the gate electrode layer 204.

Silicidation of the gate electrode layer 204 and/or at least parts of the semiconductor fins 202 (namely, the parts comprising source/drain regions) may be performed. The resulting metal silicide regions may be comprised of a variety of different materials such as, for example, nickel silicide, nickel-platinum silicide, cobalt silicide, etc., and the thickness of such metal silicide regions may vary depending upon the particular application. The typical steps performed to form the metal silicide regions involve depositing a layer of refractory metal, performing an initial heating process causing the refractory metal to react with underlying semiconductor material, for example, silicon-containing material, performing an etching process to remove unreacted portions of the layer of refractory metal, and performing an additional heating process to form the final phase of the metal silicide. An interlayer dielectric may be formed over the structure shown in FIG. 2c and contacts for electrically contacting the drain/source regions and gate electrodes may be formed in the interlayer dielectric.

In general, it is noted that drain and/or source areas of individual semiconductor fins 202 may be individually contacted by an appropriately designed contact structure formed in the interlayer dielectric in order to connect each of the corresponding drain and/or source areas of the semiconductor fins with a controllable interconnect structure that may be configured so as to enable, at least once, to control the connection of the end portions to a common node, such as a drain terminal or a source terminal of the transistor. In some illustrative aspects, the controllable interconnect structure may comprise transistor elements, for instance, formed on the basis of less critical constraints compared to the sophisticated FinFET device, thereby providing for the possibility of repeatedly reconfiguring the sophisticated transistor elements. The controllable interconnect structure may comprise conductors, such as resistive structures, and the like, which may be switched from a low impedance state into a high impedance state at least once so as to enable a disconnection of corresponding semiconductor fins from the common circuit node. For example, the controllable interconnect structure may be connected to external test equipment in order to appropriately set the transistor configuration, for instance, the current drive capability, in accordance with requirements for the specific transistor under consideration, while, in other cases, conditionally the actual functional status of the transistor under consideration may be determined and a corresponding control of the interconnect structure may be performed on the basis of the detected functional status. Furthermore, gate and body interconnects may be formed to provide electrical connections to the gates and the body of the FinFET device.

Figure 3A:
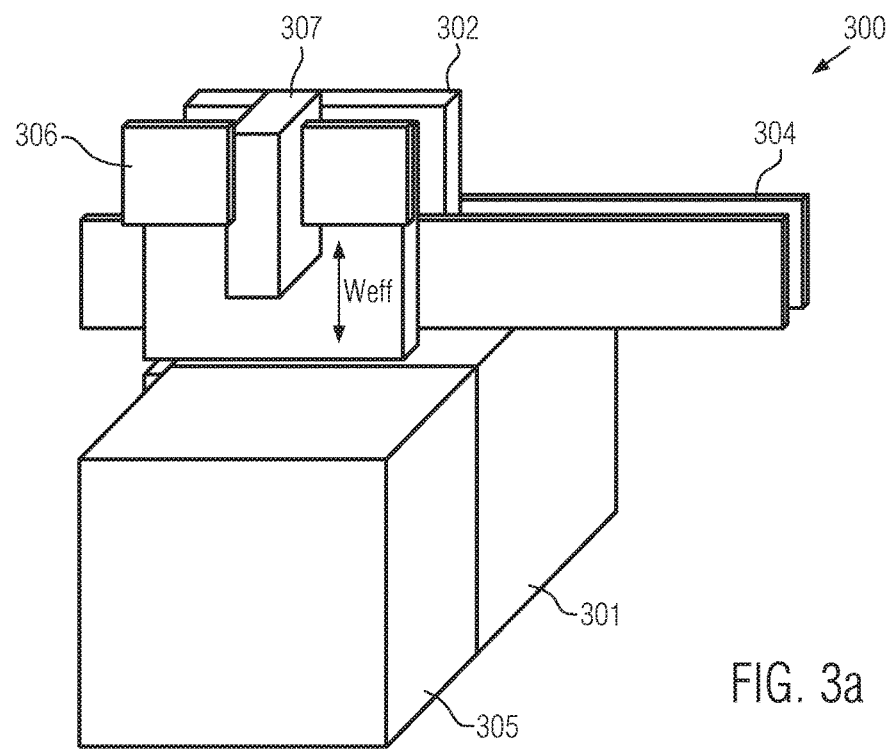
FIGS. 3a-3c illustrate a FinFET device that may be manufactured in accordance with the process flow illustrated in FIGS. 2a-2c.
Figure 3B:
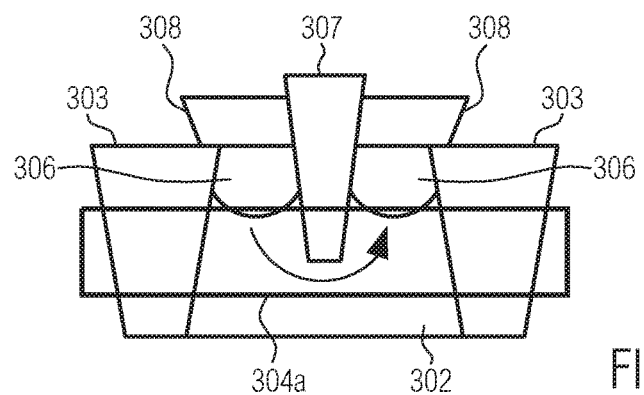
Figure 3C:
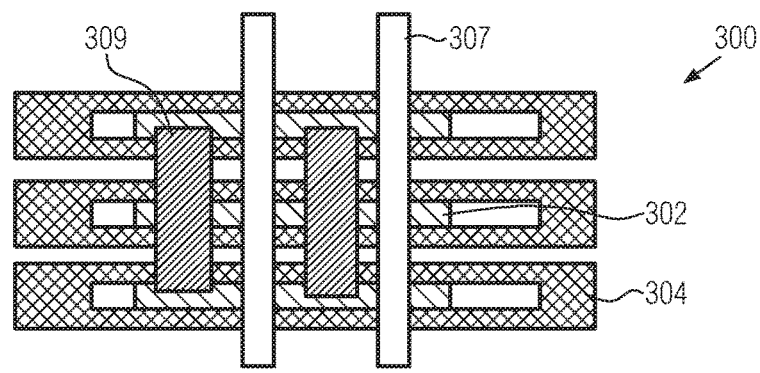

FIGS. 3a-3c illustrate a FinFET device 300 that may be manufactured in accordance with the above-described procedure. FIG. 3a represents a partially exploded 3D view of the FinFET device 300 comprising semiconductor fins 302 and a gate electrode layer 304, FIG. 3b represents a plan view parallel to the semiconductor fins 302, and FIG. 3c represents a top view of the same. The FinFET device 300 comprises a semiconductor layer 301 that may be part of a semiconductor bulk substrate as described above. Individual semiconductor fins 302 are formed on the semiconductor layer 301. The semiconductor fins 302 end in oxide sidewalls 303 as can be seen in FIG. 3b. The gate border 304a of the gate electrode layer 304 partially overlaps the oxide sidewalls 303. A gate electrode layer 304 is formed around the individual semiconductor fins 302 as can particularly be appreciated from FIG. 3c. As can be seen from FIG. 3c, in the disclosed example, the individual semiconductor fins 302 are completely enclosed by the gate electrode layer 304 in a horizontal plane. The main portions (legs) of the U-shaped gate electrode layer 304 run along the length directions of the semiconductor fins 302 in parallel to the same. An insulation oxide layer 305 is formed in the semiconductor layer 301 for electrically insulating the Fin-FET device 300 from other devices formed on the same wafer.

Figure 1C:
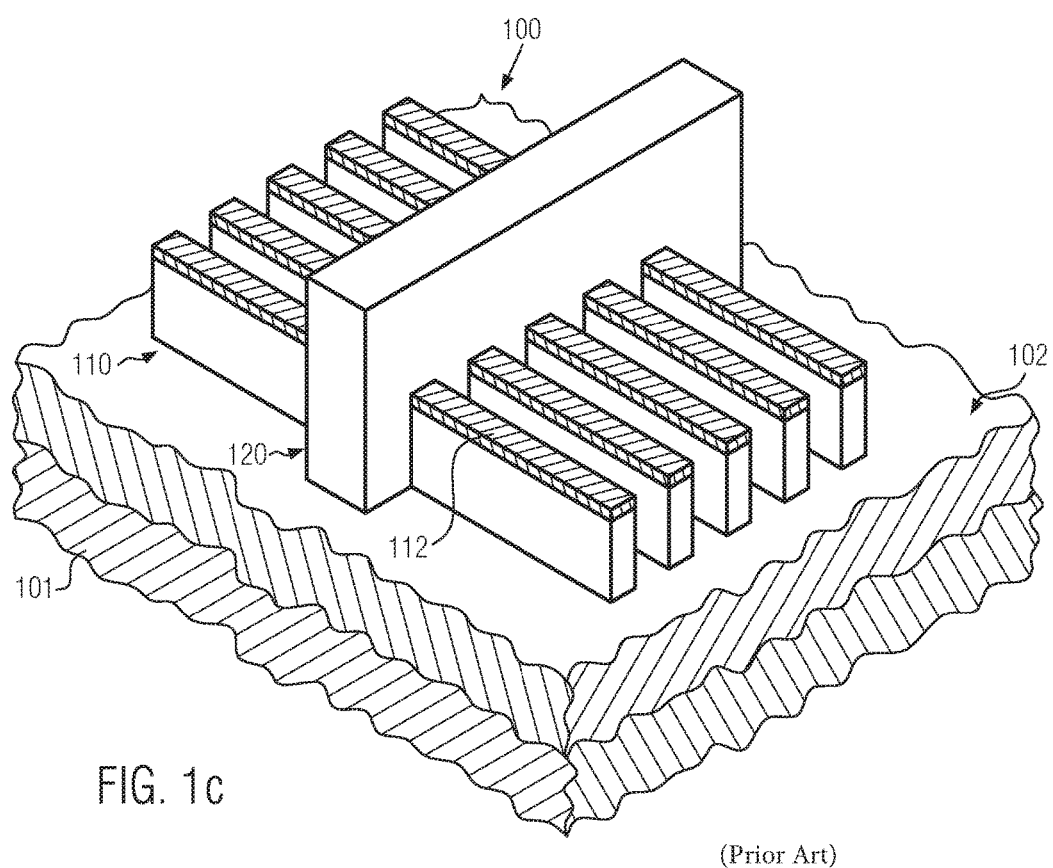

As can be appreciated from FIGS. 3a-3c, effective channel areas with effective channel lengths (along the direction of electrical current flow indicated by the arrow in FIG. 3b when the FinFet device is actively operating) and widths (heights) Weff may be enlarged as compared to the art (confer FIG. 1c). The enlarged channel regions provide for a higher operation stability and improved drive current capabilities as compared to FinFET devices of the art.

As can also be seen in FIGS. 3a and 3b, junctions 306 formed in the semiconductor fins 302 are separated from each other by oxide layers 307, for example, comprising silicon dioxide, and epitaxially grown source/drain regions 308 and the junctions 306 between the channel regions and the source/drain regions 308 can be formed vertically higher than the gate electrodes 304. Thereby, contacting of the source/drain regions 308 by contacts 309 located above the gate electrodes 304 is facilitated and the risk of electrical shorts between the source/drain regions and the gate electrodes 304 by the formation of the contacts 309 is reduced as compared to the art wherein the source/drain regions and junctions are formed substantially in the same plane as the gate electrode layer (confer FIG. 1c).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
    a semiconductor layer;
    a plurality of semiconductor fins formed on a surface of said semiconductor layer, said semiconductor fins extending in parallel along a first direction that is parallel to said surface of said semiconductor layer, wherein said semiconductor fins have a first length in said first direction and have a first height in a second direction that is perpendicular to said first direction; and
    a plurality of gate electrodes formed over said surface of said semiconductor layer, said gate electrodes comprising longitudinal portions extending parallel to said semiconductor fins along said first direction, wherein said longitudinal portions of said gate electrodes have a second length in said first direction that is greater than said first length and have a second height in said second direction that is less than said first height.

2. The semiconductor device of claim 1, further comprising high-k dielectric layers between said semiconductor fins and said longitudinal portions of said gate electrodes.

3. The semiconductor device of claim 1, wherein said gate electrodes are part of a single gate electrode layer.

4. The semiconductor device of claim 1, wherein each of said semiconductor fins comprises a source region and a drain region, said semiconductor device further comprising contacts formed in electrical contact with said source and drain regions, and wherein said contacts are formed at a third height in said second direction that is greater than said second height.

5. The semiconductor device of claim 1, wherein said semiconductor fins have widths in a third direction perpendicular to said first and second directions and wherein said gate electrodes comprise latitudinal portions in parallel to said widths of said semiconductor fins in said third direction.

6. A FinFET device, comprising
    a plurality of semiconductor fins formed on a surface of a semiconductor layer extending in parallel to each other in a first direction parallel to said surface of said semiconductor layer, wherein each of said semiconductor fins comprises a transistor channel region; and
    a gate electrode layer extending along said first direction between said semiconductor fins and extending over sidewalls of said semiconductor fins in a second direction that is perpendicular to said first direction, wherein a length of said gate electrode layer in said first direction is greater than a length of said semiconductor fins in said first direction and wherein a height of said gate electrode layer in said second direction is less than a height of said semiconductor fins in said second direction.

7. The FinFET device of claim 6, wherein each of said semiconductor fins is enclosed by a part of said gate electrode layer in a plane parallel to said surface of said semiconductor layer.

8. The FinFET device of claim 6, wherein each of said semiconductor fins comprises a source region and a drain region.

9. The FinFET device of claim 6, wherein each of said semiconductor fins comprises a source region and a drain region, said semiconductor device further comprising contacts formed in electrical contact with said source and drain regions, and wherein said contacts are formed above said gate electrode layer.

10. The FinFET device of claim 6, wherein said semiconductor layer is part of a semiconductor bulk substrate.

11. The FinFET device of claim 6, wherein said transistor channel region extends in said first direction and said second direction substantially over the entire height of said gate electrode layer.

12. A semiconductor device, comprising: a semiconductor fin positioned above a surface of a semiconductor layer, wherein said semiconductor fin extends over said surface along a first direction that is substantially parallel to said surface; and a gate electrode structure positioned above said surface of said semiconductor layer, wherein said gate electrode structure laterally surrounds and encloses said semiconductor fin on four lateral sides when said semiconductor device is viewed in a planar cross section taken through said semiconductor fin and said gate electrode structure that is parallel to said surface.

13. The semiconductor device of claim 12, wherein a length of said gate electrode structure in said first direction is greater than a length of said semiconductor fin in said first direction.

14. The semiconductor device of claim 12, wherein said gate electrode structure extends upward over sidewalls of said semiconductor fin in a second direction that is substantially perpendicular to said first direction and substantially normal to said surface of said semiconductor layer, a height of said gate electrode structure above said surface in said second direction being less than a height of said semiconductor fin above said surface in said second direction.

15. The semiconductor device of claim 12, wherein said gate electrode structure comprises a gate dielectric layer and a gate electrode material layer.

16. The semiconductor device of claim 12, wherein said gate dielectric layer comprises a high-k material layer and said gate electrode material layer comprises a work function adjusting layer.

17. The semiconductor device of claim 12, wherein said semiconductor fin is a first semiconductor fin and said gate electrode structure is a first gate electrode structure, the semiconductor device further comprising:
at least one second semiconductor fin that extends parallel to said first semiconductor fin in said first direction; and
at least one second gate electrode structure that extends parallel to said first gate electrode structure in said first direction, wherein said at least one second gate electrode structure laterally surrounds and completely encloses said at least said one second semiconductor fin on four sides.

18. The semiconductor device of claim 12, wherein said semiconductor fin is a first semiconductor fin, the semiconductor device further comprising at least one second semiconductor fin that extends parallel to said first semiconductor fin in said first direction, wherein said gate electrode structure laterally surrounds and completely encloses said at least said one second semiconductor fin on four sides.

19. The semiconductor device of claim 12, further comprising sidewall spacers positioned at opposing ends of said semiconductor fin, wherein said gate electrode structure laterally surrounds said sidewall spacers.

* * * * *